United States Patent [19]

Bendell et al.

[11] 4,435,730
[45] Mar. 6, 1984

[54] LOW NOISE CCD OUTPUT

[75] Inventors: Sidney L. Bendell, Riverton; Peter A. Levine, Trenton, both of N.J.

[73] Assignee: RCA Corporation, New York, N.Y.

[21] Appl. No.: 356,212

[22] Filed: Mar. 8, 1982

[51] Int. Cl.³ ............................................. H04N 3/14
[52] U.S. Cl. ................................... 358/213; 333/165; 358/167
[58] Field of Search ........................ 358/213, 167, 36; 328/167; 377/58, 60, 63; 333/165

[56] References Cited

U.S. PATENT DOCUMENTS 2,514,022  7/1950  Bedford .............................. 328/167

Primary Examiner—John C. Martin
Assistant Examiner—Michael D. Parker
Attorney, Agent, or Firm—E. M. Whitacre; W. H. Meise; H. I. Steckler

[57] ABSTRACT

Output signals are derived from two portions of a CCD imager. The first output signal is derived from a drain diffusion in the form of a signal current and applied to an amplifier with poor high frequency S/N due to needed high frequency peaking. The second output signal is derived from a floating diffusion (or floating gate) through an on-chip MOSFET amplifier which has a poor low frequency S/N due to 1/f noise. The first and second output signals are filtered through complementary LPF and HPF respectively and then combined together.

8 Claims, 3 Drawing Figures

LOW NOISE CCD OUTPUT

BACKGROUND OF THE INVENTION

The present invention relates to apparatus for processing the output signals from CCDs (charge coupled devices), such as used for imaging and more particularly, to such processing that improves the S/N (signal-to-noise ratio).

When using a CCD imager, the output signal is derived from a clocked "C" register. This output signal can be derived from either an on-chip charge-to-voltage converter, such as a floating diffusion, or the signal current may be obtained directly from a drain diffusion, such as a reset drain. If the output signal is derived from the floating diffusion, it is buffered by a MOSFET amplifier which must be integrated onto the same chip as that in which the imager is formed to achieve low input capacitance. However, such transistors have a large 1/f noise, i.e., the noise energy per unit of bandwidth increases as frequency decreases. In particular, this noise is especially troublesome from D.C. to about 100 kilohertz and causes random horizontal streaks and flicker in the displayed image. These streaks and flicker are highly visible under low illumination conditions. If the output signal is derived from the reset drain, it is applied to an amplifier that can be made to have low 1/f noise by using a J-FET (junction-field-effect transistor), which inherently has high capacitive input loading. This loading causes a loss of high frequencies, which loss may be compensated by high frequency peaking. This peaking causes increased high frequency noise, which is displayed in the reproduced picture as "snow" or "salt and pepper noise".

It is therefore desirable to process output signals from a CCD to maximize the signal-to-noise ratio to thereby minimize streaking and snow in the reproduced picture.

SUMMARY OF THE INVENTION

Method and apparatus for processing first and second signals from a pair of signal sources, said signals having the same information content and approximately opposite noise versus frequency characteristics, comprising filtering each of said signals with complementary low and high pass filters, respectively, to produce filtered signals having reduced noise, and combining said filtered signals together.

DETAILED DESCRIPTION

Figure 1:
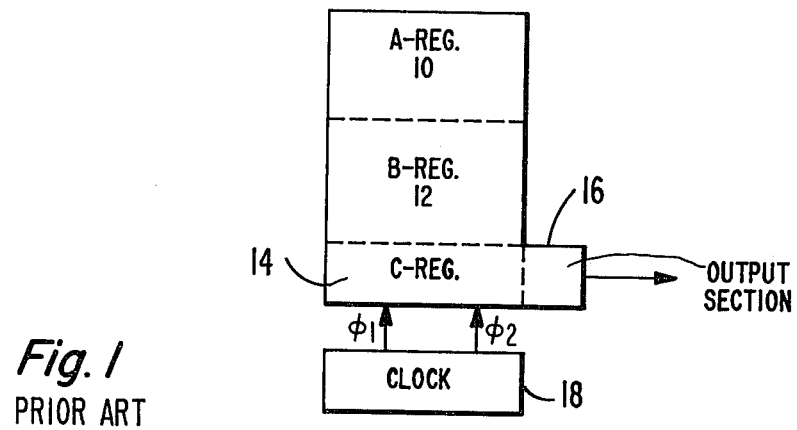
FIG. 1 is a symbolic drawing of a prior art CCD imager.

FIG. 1 shows a CCD imager for use with the invention. It will be assumed that it is a two-phase device, although the invention can be used with three-or four-phase imagers. In general, it comprises A, B and C registers 10, 12, and 14, respectively and an output section 16. A-register 10 comprises a matrix of photosensitive elements upon which radiant energy, such as light, is incident from a scene being viewed (not shown). Charge proportional to the energy intensity is generated, and the accumulated charge is stored for somewhat less than one television field period. During the vertical blanking interval, the accumulated charge is transferred in columns from A-register 10 to B-register 12 under the control of a clock signal (source not shown). During each horizontal blanking interval, the entire charge pattern in B-register 12 is moved down one line causing one horizontal line of charges at a time to be parallel-shifted into C-register 14 under the control of a clock signal (source not shown). During the next active portion of the horizontal line time, the charge packets are serially read out from output section 16 under the control of a two phase clock signal from source 18, which can have output signals labelled as $\Phi_1$ and $\Phi_2$ having a frequency of, e.g., about 10 MHz for an imager operated at NTSC rates and having about 500 elements in the horizontal direction. During the next horizontal blanking interval another horizontal line is parallel shifted into C-register 14 from B-register 12, etc. Eventually all lines stored in B-register 12 are shifted into and then read out from C-register 14. B-register 12 is now ready to receive another field of charges from A-register 10, which charges A-register 10 has been accumulating.

Figure 2:
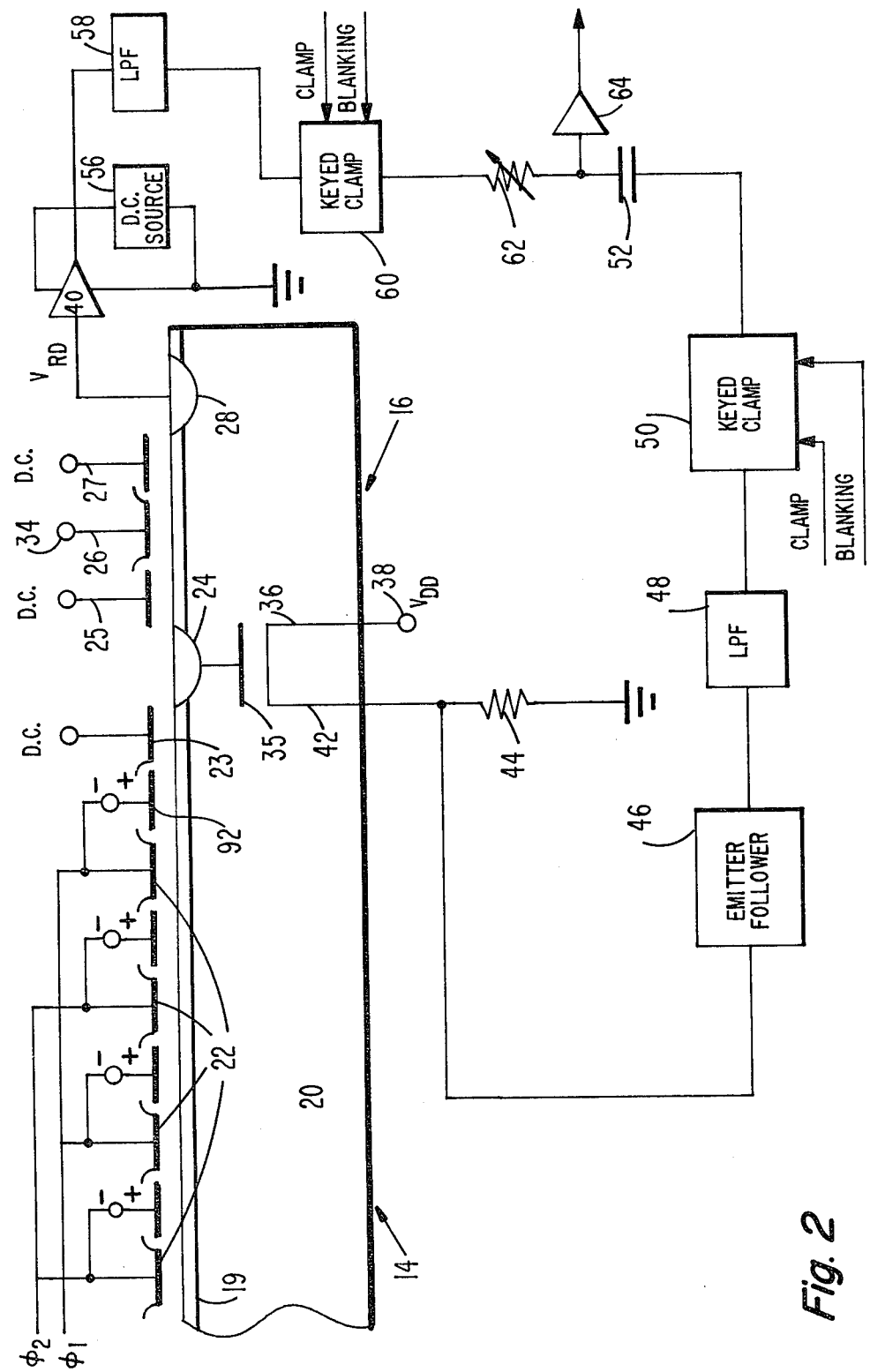
FIG. 2 is a partly cross-sectional view of a portion of the imager of FIG. 1 and a partly block diagram of a signal processing circuit in accordance with a first embodiment of the invention.

FIG. 2 shows in its upper left hand portion details of the right end of C-register 14 (shown as a buried channel device, but a surface channel device can also be used) and output section 16. A P-type substrate 20 (assuming an N-channel CCD) has disposed above it on a silicon dioxide layer (not shown) a plurality of gate electrodes 22, alternate ones of which electrodes 22 receive the mutually out of phase clock signals $\Phi_1$ and $\Phi_2$. Said plurality extends to the left for substantially the entire length of substrate 20. N-doped layer 19 causes the minimum of the potential wells to move away from the top surface to achieve buried channel operation. Under the control of the clock signals, the charge packets (not shown) are shifted to the right. When $\Phi_1$ goes low or negative (for an N-channel device), a packet is almost instantaneously shifted past gate 23 to a floating diffusion 24 of output section 16. Diffusion 24 serves as a source electrode of an FET comprising reset gate 26, D.C. gates 25 and 27, and reset drain 28. Drain 28 is connected to positive (for an N-channel CCD) source of voltage supplied by amplifier 40 (described below). Gate 26 receives from terminal 34 a reset signal R. Gate 23 receives a D.C. bias and shields diffusion 24 from the C-clock signals present on electrodes 22. Similarly, gates 25 and 27 prevent the reset clock signal from being coupled to floating diffusion 24 and reset drain 28 respectively. Further, gates 23, 25 and 27 all substantially prevent random noise in the clock and reset signals from coupling to diffusion 24 and drain 28 as the case may be. This obviates the need for noise-free clock and reset signals.

When signal R occurs (goes high or positive), the voltage $V_{RD}$ present at the input of amplifier 40 is applied to diffusion 24 through a conductive channel in substrate 20. When signal R goes low the channel becomes nonconductive, and signal $\Phi_1$ also goes low after a slight time delay, and therefore the electrons of the charge packet under electrode 92 are transferred to diffusion 24 to lower the positive potential thereon by an amount proportional to the number of electrons in the charge packet, which in turn is proportional to the light incident upon that area of A-register 10 from which the particular charge packet was originally derived. This new lower voltage on diffusion 24 is held until signal R goes high again.

Since the number of electrons in a charge packet is relatively small, the diffusion 24 capacitance must be small to obtain a useable output voltage. Therefore, output section 16 comprises a MOSFET buffer amplifier comprising a gate 35 connected to diffusion 24, a drain 36 connected by way of terminal 38 to a source of positive voltage $V_{DD}$, and a source 42 coupled to ground through a resistor 44. It will be appreciated that such a configuration forms a source follower. In general, resistor 44 should be small for a large bandwidth; however, since it forms a voltage divider with the internal resistance of the MOSFET, which divider reduces the output voltage, it should not be too small. A problem with the MOSFET is that it has a large amount of 1/f noise, i.e. the noise energy per unit of bandwidth increases with decreasing frequency, although the low capacitance of diffusion 24 provides a high S/N at high frequencies. In contradistinction, an output current signal derived from drain 28 is applied to amplifier 40, which because of capacitive input loading on drain 28 needs high frequency peaking, thereby having poor S/N at high frequencies. However, amplifier 40 can have J-FET or bipolar input transistors, which are relatively free of 1/f noise. Such transistors cannot easily be fabricated on a common substrate as the CCD imager to reduce input capacitance and thus also cannot be used to form the on-chip source follower in place of the MOSFET. The present invention is directed at substantially avoiding the effects of these problems.

The output signal from the on-chip source follower is applied to LPF (low pass filter) 48 through an impedance matching emitter follower 46. LPF 48 preferably has a cut-off frequency of one half the C-clock 18 frequency, i.e. the Nyquist frequency, which is 5 MHz for a 10 MHz clock. LPF 48 also reduces aliasing (spectrum overlapping) between the baseband video signal and the lower video signal sideband of a pair of video signal sidebands centered about the clock frequency.

The output signal from LPF 48 is applied to keyed clamp 50. A clamping signal is applied to clamp 50 from a source (not shown), which signal has a duration of about 0.5 µs and occurs during the overscan of the C-register 14 when clock signals $\Phi_1$ and $\Phi_2$ continue for a short duration during the horizontal blanking interval after all the charge transferred from B-register 12 has been read out. This allows dark signal current from the C-register 14 to be clamped to a desired reference level. A blanking signal is also applied to circuit 50 during the entire overscan duration to prevent noise and any residual C-clock signal from appearing in the output signal from clamp circuit 50. Clamp circuit 50 has a low output impedance (for reasons explained below) and applies its output signal to capacitor 52. Also clamp 50 has an inverting output since the signal from diffusion 24 is inverted (increasing amplitude is in black direction) and positive going signals with increasing brightness are preferred.

The output signal from reset drain 28 is applied to amplifier 40, which amplifier is coupled to D.C. source 56 having a potential of 20 volts in a particular embodiment. Thus amplifier 40 applies a potential $V_{RD}$ of +15 volts to reset drain 28. Amplifier 40 includes a J-FET (junction-field effect transistor) input stage, which has very low 1/f noise. In addition, amplifier 40 has a very low input impedance in order to supply a high enough current to reset diffusion 24 in the time allowed. This low input impedance can be achieved using negative feedback. The output signal of amplifier 40 is applied to LPF 58, which can be identical to LPF 48. This filter removes the signal feed-through from C-clock 18 from the output video signal, but need not remove aliasing since the video signal will be further low pass filtered as explained below. The output signal from LPF 58 is applied to keyed clamp 60, which is identical to clamp 50 and receives identical clamping and keying signals. Clamp 60 has a low output impedance and applies its output signal to variable resistor 62.

Since the output impedance of clamp 50 is low, the signal from clamp 60 is applied to an R-C (resistance-capacitance) low pass filter comprising resistor 62 and capacitor 52. Thus the high frequency signal and noise due to high frequency peaking of amplifier 40 is attenuated. Since the output impedance of clamp 60 is low, the output signal from clamp 50 is applied to an R-C HPF (high pass filter) comprising resistor 62 and capacitor 52. The thus filtered signals are combined and applied to amplifier 64, which can be an emitter follower, and which provides the output signal of the invention.

It will be noted that since the HPF and LPF comprise the same components 62 and 52, their transfer characteristics are exactly complementary. This is important even though the noise characteristics are not exactly complementary, since then the HPF and LPF have transient responses which are opposite in phase. Therefore when their output signals are added, the two transient characteristics substantially cancel. The crossover frequency is controllable by varying resistor 62 or alternatively capacitor 52. This frequency is not critical and frequencies from 50 KHz to 1 MHz have been successfully used. There is a 3 dB improvement in S/N at the crossover frequency since the signals added coherently, while the noise adds incoherently. For the HPF and LPF to work properly, the signals applied to resistor 62 and capacitor 52 must be in phase. This may require a delay line in one of the output signal channels 46, 48, and 50 or 40, 58, and 60.

Figure 3:
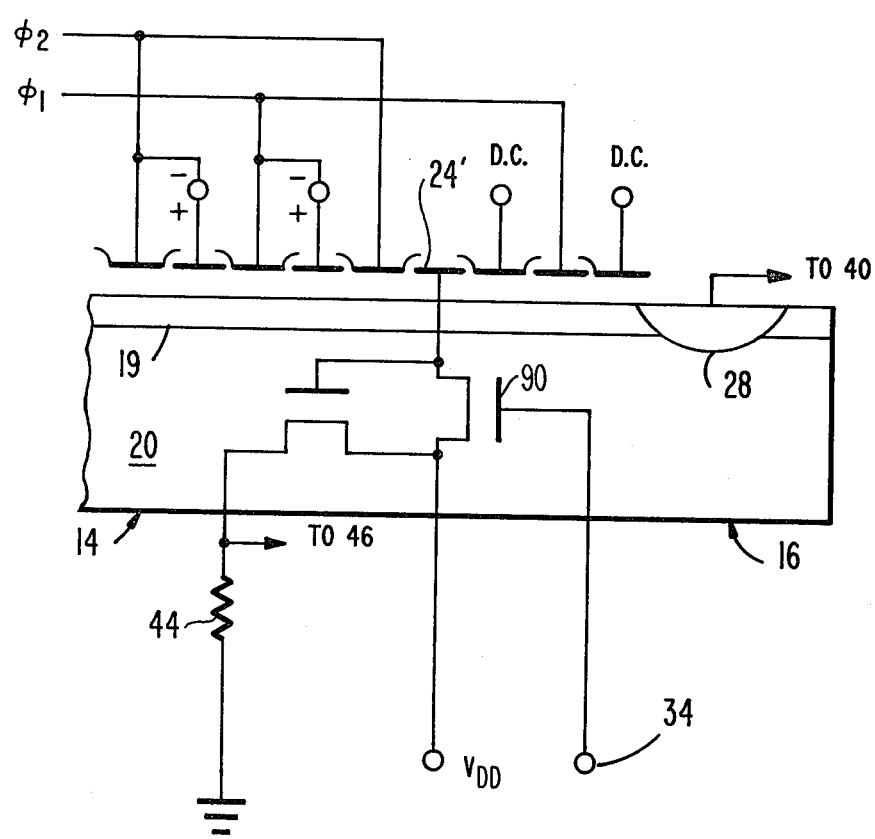
FIG. 3 shows a second embodiment of the invention.

It will be appreciated that many other embodiments are possible within the spirit and scope of the invention. For example, one could make complementary filters by having an LPF in the signal path coupled to reset drain 28, and an HPF comprising an indentical LPF, and a delay element coupled to respective inputs of a subtractor, the whole HPF circuit coupled in the signal path coupled to floating diffusion 24. It should also be pointed out that, as shown in FIG. 3, a floating gate 24' may be substituted as a signal output for the floating diffusion 24 of FIG. 2, the off-chip circuitry remaining the same. This gate 24' is not reset through the CCD output drain diffusion 28 but is reset through transistor 90 to voltage $V_{DD}$ by a reset signal at terminal 34, and therefore relaxes the need for a low impedance input for amplifier 40. The floating gate output can be reset once per line by a reset signal received at terminal 34. This gives a reset noise at the line rate which will not pass through the HPF comprising 52 and 62.

Also the principle of the invention can be applied to other charge transfer devices, such as bucket brigade devices. Further the invention is not limited to imagers, but also can be used with delay lines.

What is claimed is:

1. Apparatus for processing first and second video signals from first and second signal sources, said signals having opposite noise versus frequency characteristics, said apparatus comprising filtering means for filtering each of said signals with complementary low and high pass filters, respectively, to produce filtered signals having reduced noise, combining means for combining said filtered signals together; and
  a pair of circuit means for clamping and blanking each of said video signals respectively.

2. Apparatus as claimed in claim 1, wherein said first signal source comprises a reset drain of a CCD imager, and said second signal source comprises a floating diffusion of said CCD imager.

3. Apparatus as claimed in claim 1, wherein said filter means comprises a series combination comprising a resistor and a capacitor, said first and second signals being applied to said resistor and said capacitor respectively.

4. Apparatus as claimed in claim 1, wherein said first signal source comprises a signal drain of a CCD imager, and said second signal source comprises a floating gate of said CCD imager.

5. Apparatus for processing first and second video signals from first and second signal sources, said signals having opposite noise versus frequency characteristics, said first signal source comprising a reset drain of a CCD imager, said second signal source comprising a floating diffusion of said CCD imager, said apparatus comprising filtering means for filtering each of said signals with complementary low and high pass filters, respectively, to produce filtered signals having reduced noise, and combining means for combining said filtered signals together.

6. Apparatus as claimed in claim 5, wherein said filter means comprises a series combination comprising a resistor and a capacitor, said first and second signals being applied to said resistor and said capacitor respectively.

7. Apparatus for processing first and second video signals from first and second signal sources, said signals having opposite noise versus frequency characteristics, said first signal source comprising a signal drain of a CCD imager, and said second signal source comprising a floating gate of said CCD imager; said apparatus comprising filtering means for filtering each of said signals with complementary low and high pass fitlers, respectively, to produce filtered signals having reduced noise, and combining means for combining said filtered signals together.

8. Apparatus as claimed in claim 7, wherein said filter means comprises a series combination comprising a resistor and a capacitor, said first and second signals being applied to said resistor and said capacitor respectively.

* * * * *